(12) United States Patent
Borowik et al.

(10) Patent No.: US 8,647,957 B2
(45) Date of Patent: Feb. 11, 2014

(54) METHOD FOR MAKING SEMI-CONDUCTOR NANOCRYSTALS

(75) Inventors: Lukasz Borowik, Grenoble (FR); Jean-Charles Barbe, Izeron (FR); Ezra Bussmann, Albuquerque, NM (US); Fabien Cheynis, Marseilles (FR); Frederic Leroy, Marseilles (FR); Denis Mariolle, Grenoble (FR); Pierre Muller, Marseilles (FR)

(73) Assignees: Commissariat à l'énergie atomique et aux énergies alternatives, Paris (FR); Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 13/464,363

(22) Filed: May 4, 2012

(65) Prior Publication Data
US 2012/0282758 A1    Nov. 8, 2012

(30) Foreign Application Priority Data

May 6, 2011    (FR) ...................................... 11 53927

(51) Int. Cl.
*B82Y 40/00*    (2011.01)
(52) U.S. Cl.
USPC ........................... 438/378; 977/855; 977/773
(58) Field of Classification Search
USPC ......................................................... 977/855
See application file for complete search history.

(56) References Cited

U.S. PATENT DOCUMENTS

| | | | |
|---|---|---|---|
| 3,369,164 A | 2/1968 | Ball | |
| 6,090,666 A | 7/2000 | Ueda et al. | |
| 7,544,547 B2 * | 6/2009 | Fournel et al. | 438/142 |
| 7,995,871 B2 * | 8/2011 | Guerra | 385/1 |
| 2004/0043586 A1 * | 3/2004 | Ahmed et al. | 438/514 |
| 2005/0136655 A1 | 6/2005 | Wasshuber et al. | |
| 2006/0019459 A1 * | 1/2006 | Vinet et al. | 438/378 |
| 2006/0046384 A1 | 3/2006 | Joo et al. | |
| 2006/0091105 A1 | 5/2006 | Barbe et al. | |
| 2007/0007596 A1 | 1/2007 | Wasshuber et al. | |

(Continued)

FOREIGN PATENT DOCUMENTS

| | | |
|---|---|---|
| EP | 1 619 277 A2 | 1/2006 |
| FR | 2 872 626 A1 | 1/2006 |
| WO | WO 2009/125509 A1 | 10/2009 |

OTHER PUBLICATIONS

V Palermo, D Jones, Formation of nanoclusters on silicon from carbon deposition, Applied Surface Science, vol. 226, Issues 1-3, Mar. 15, 2004, pp. 191-196.*

(Continued)

*Primary Examiner* — Charles Garber
*Assistant Examiner* — Regan J Rundio
(74) *Attorney, Agent, or Firm* — Oblon, Spivak, McClelland, Maier & Neustadt, L.L.P.

(57) ABSTRACT

A method for making semi-conductor nanocrystals, including at least the steps of:
  forming solid carbon chemical species on a semi-conductor thin layer provided on at least one dielectric layer, the dimensions and the density of the carbon chemical species formed on the semi-conductor thin layer being a function of the desired dimensions and density of the semi-conductor nanocrystals;
  annealing the semi-conductor thin layer, performing a dewetting of the semi-conductor and forming, on the dielectric layer, the semi-conductor nanocrystals.

11 Claims, 4 Drawing Sheets

(56) References Cited

U.S. PATENT DOCUMENTS

| | | |
|---|---|---|
| 2007/0077712 A1 | 4/2007 | Joo et al. |
| 2009/0250700 A1 | 10/2009 | Afentakis et al. |
| 2010/0062587 A1 | 3/2010 | Wasshuber et al. |
| 2010/0081259 A1* | 4/2010 | Lai et al. .................. 438/473 |
| 2010/0256408 A1* | 10/2010 | Veinot et al. .................. 556/431 |

OTHER PUBLICATIONS

T. Hopf, J. Leveneur, A. Markwitz, Growth of silicon carbide surface nanocrystals on silicon under high-temperature vacuum annealing, Vacuum, vol. 86, Issue 2, Sep. 2, 2011, pp. 165-170.*

B Pécz, J Stoemenos, M Voelskow, W Skorupa, L Dobos, A Pongrácz and G Battistig, Ion implantation enhanced formation of 3C-SiC grains at the SiO2/Si interface after annealing in CO gas, Journal of Physics: Conference Series, vol. 209, 2010.*

Preliminary Search Report issued Feb. 9, 2012 in French Patent Application No. FR 1153927 (with English Translation of Categories of Cited Documents).

G. Capellini, et al., "Agglomeration process in thin silicon-, strained silicon-, and silicon germanium-on-insulator substrates", Journal of Applied Physics, vol. 105, No. 9, 2009, pp. 093525-1-093525-8.

E. Dornel, et al., "Surface diffusion dewetting of thin solid films: Numerical method and application to $Si/SiO_2$", Physical Review B 73, 2006, pp. 115427-1-115427-10.

E. Dornel, et al., "Orientation-Dependent Dewetting of Patterned Thin Si Film on $SiO_2$", Mater. Res. Soc. Symp. Proc., vol. 910, 2006, 6 pages.

J. Tersoff, et al., "Shape Transition in Growth of Strained Islands: Spontaneous Formation of Quantum Wires", Physical Review Letters, vol. 70, No. 18, May 3, 1993, 5 pages.

Suklyun Hong, et al., "Effect of hydrogen on the surface-energy anisotropy of diamond and silicon", Physical Review B, vol. 57, No. 11, Mar. 15, 1998, pp. 6262-6265.

R.C. Henderson, "Silicon Cleaning with Hydrogen Peroxide Solutions: A High Energy Electron Diffraction and Auger Electron Spectroscopy Study", J. Electrochem. Soc. : Solid-State Science and Technology, 119, Jun. 6, 1972, pp. 772-775.

U.S. Appl. No. 13/464,390, filed May 4, 2012, Borowik, et al.

* cited by examiner

METHOD FOR MAKING SEMI-CONDUCTOR NANOCRYSTALS

TECHNICAL FIELD

The invention relates to a method for making semi-conductor nanocrystals obtained by dewetting a semi-conductor thin layer provided on a dielectric layer, and which can be used for making microelectronic and/or nanoelectronic devices, for example memory devices or LED type light emissive devices.

The invention also relates to a method for making a porous dielectric layer resorting to semi-conductor nanocrystals.

The invention also relates to a method for making semi-conductor nanocrystals accurately positioned in the thickness of a stack of layers comprising at least one dielectric material.

STATE OF PRIOR ART

For making semi-conductor nanocrystals, that is semi-conductor aggregates the dimensions of which can be between about a few nanometres and a few hundred nanometres, it is known to make a dewetting of a silicon thin layer provided on a $SiO_2$ layer. Indeed, when the silicon thin layer, forming for example the active layer, or upper layer, of a SOI (silicon on insulator) substrate, is subjected to a high temperature annealing, for example between about 650° C. and 1250° C., the silicon of this thin layer gradually retracts on itself forming silicon nanocrystals, or aggregates.

Document EP 1 619 277 A2 describes that it is possible to accurately locate areas where it is desired that part of the semi-conductor layer should form nanocrystals by dewetting, by performing in particular a doping and an exposure by electron beam of these areas, prior to a high temperature annealing under a hydrogenated atmosphere.

Document "Agglomeration process in thin-silicon-, strained silicon-, and silicon germanium-on-insulator substrates>> by G. Capellini et al., Journal of applied physics, vol. 105, 2009, describes that the dewetting can be influenced depending on whether a stressed semi-conductor layer is used or not. The higher the biaxial stress to which the semi-conductor is subjected and/or the thinner the semi-conductor layer, the more reduced the size of the semi-conductor nanocrystals and the higher the density of nanocrystals. By increasing the biaxial stress value, it is possible to reduce the dimensions of nanocrystals, in the plane of the semi-conductor layer, up to about 145 nm.

The dimensions of these nanocrystals however are too large to be used in some nanoscale electronic devices, such as memory devices wherein the dimensions of electric active areas must sometimes be lower than 145 nm.

DESCRIPTION OF THE INVENTION

Thus there is a need to provide a method for making semi-conductor nanocrystals enabling the density and the dimensions of the semi-conductor nanocrystals to be controlled, and enabling nanocrystals having low dimensions, in particular lower than about 50 nm, to be made.

To do this, one embodiment provides a method for making semi-conductor nanocrystals, including at least the steps of:
  forming carbon chemical species on a semi-conductor thin layer provided on at least one dielectric layer, the density of the carbon chemical species formed on the semi-conductor thin layer being a function of the desired dimensions and density of the semi-conductor nanocrystals;
  annealing the semi-conductor thin layer, performing a dewetting of the semi-conductor and forming, on the dielectric layer, the semi-conductor nanocrystals.

The carbon chemical species formed on the semi-conductor thin layer are solid, corresponding for example to solid particles.

This method is based on the physical phenomenon of dewetting occurring when a semi-conductor thin layer, for example of silicon, is subjected to a high temperature heat treatment.

The term "carbon chemical species" herein stands for carbon in the atomic form and/or at least one organic compound, that is a compound comprising at least one carbon atom bonded to at least one hydrogen atom, such as for example one of the organic compounds of the following list given by way of illustrating and not exclusive way: Styrene; pyrrolidine; 1-(1-propenyl); benzaldehyde; Phenol; cyclopropane, octyl; 1-hexanol, 2-ethyl-; 2,2,6,6-tetramethyl-4-piperidone; benzoic acid; N-(1-cyano-1-methylethyl)isobutyramide; caprolactam; phthalic anhydride; tetradecene; N(2)-isobutyryl-2-methylalaninamide; di-epi-alpha-cedrene; pentadecene; hexadecene; TXIB; Diethyl phthalate; Heptadecene; benzoic acid, ethylhexylester; Diisobutyl phthalate; 7,9-di-tert-butyl-oxaspiro(4,5)deca-6,9-diene-2,8-dione; Dibutyl phthalate; 2,6-Ditert-butyl-4-methylphenylmethylcarbamate.

This method enables the size and density of semi-conductor nanocrystals obtained by dewetting to be controlled. To do this, this method proposes to control the dewetting thanks to the prior control of density and dimensions of the carbon chemical species located, deposited or formed, onto the semi-conductor thin layer, which enables in particular, as compared to the dewetting method of prior art, and for a semi-conductor thin layer having the same thickness, nanocrystals having reduced dimensions, in particular lower than about 50 nm, to be obtained.

The formation of carbon chemical species onto the semi-conductor thin layer may include at least an annealing of the semi-conductor thin layer, forming aggregates of impurities and/or carbon aggregates, for example composed of semi-conductor carbide, corresponding to the carbon chemical species.

The formation of carbon chemical species onto the semi-conductor thin layer may include a step of chemically treating the semi-conductor thin layer capable of reducing the amount of impurities lying on the semi-conductor thin layer, and an annealing of the semi-conductor thin layer decomposing the impurities and forming aggregates of impurities corresponding to the carbon chemical species. Such an annealing may be performed at a temperature between about 600° C. and 800° C.

The chemical treatment step may include applying a solution comprising $H_2O_2$ and $H_2SO_4$ against the semi-conductor thin layer.

The formation of carbon chemical species onto the semi-conductor thin layer may include a step of depositing carbon onto the semi-conductor thin layer, and an annealing of the semi-conductor thin layer decomposing the deposited carbon and forming carbon aggregates, or carbon nanocrystals, corresponding to said carbon chemical species. Such an annealing may be performed at a temperature between about 600° C. and 800° C., or at a temperature higher than 800° C. When the temperature is higher than 800° C., carbon aggregates are formed but the formation of aggregates is then coupled to the dewetting.

The deposition of carbon onto the semi-conductor thin layer may be performed in an environment the environmental pollution of which may consist of carbon species and may include exposing the semi-conductor thin layer by an electron beam. Such an exposure performs a cracking of said carbon species and deposits the carbon in the atomic form at the surface of the semi-conductor thin layer.

The semi-conductor of the thin layer may be stressed, for example uniaxially, the value of this stress being selected as a function of the desired dimensions and density of the semi-conductor nanocrystals.

The annealing of the semi-conductor thin layer may be performed at a temperature between about 600° C. and 1250° C. and in a ultra-high vacuum environment, that is at a pressure between about $10^{-7}$ mbar and $10^{-12}$ mbar.

The steps of forming the carbon chemical species and annealing the semi-conductor thin layer may be implemented in a scanning electron microscope.

The annealing of the semi-conductor thin layer may be sustained until the semi-conductor nanocrystals chemically react with the dielectric layer forming a plurality of holes passing partially or totally through the dielectric layer.

The method may further include after the step of annealing the semi-conductor thin layer, a step of plugging the holes by depositing at least one material into the holes.

The invention also relates to a method for making a porous dielectric layer, including at least implementing a method for making semi-conductor nanocrystals such as described above, wherein the annealing of the semi-conductor thin layer may be sustained until the semi-conductor nanocrystals chemically react with the dielectric layer forming a plurality of holes passing partially or totally through the dielectric layer.

BRIEF DESCRIPTION OF THE DRAWINGS

The present invention will be better understood upon reading the description of embodiments given by way of illustrating purposes only and in no way limiting by making reference to the appended drawings wherein.

Identical, similar or equivalent parts of the different figures described herein below have the same reference numerals so as to facilitate switching from one figure to another.

Figure 1:
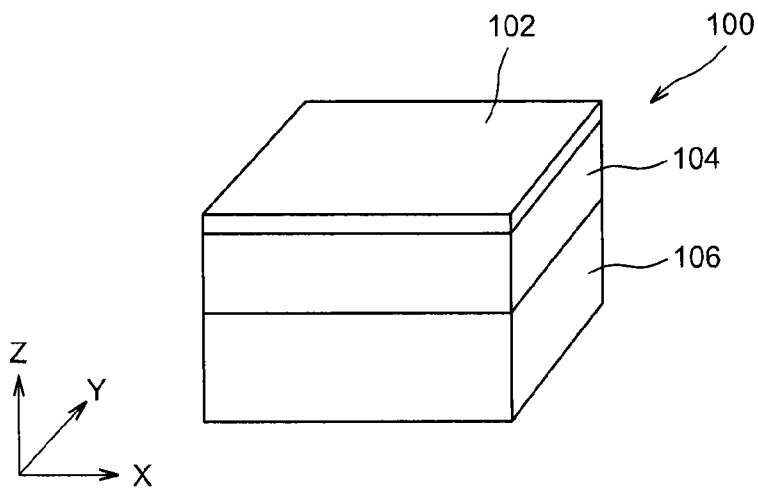
FIGS. 1 and 2 represent the steps of the method for making semi-conductor nanocrystals.

The different parts represented in the figures are not necessarily drawn to a uniform scale, for a better understanding of the figures.

The different possibilities (alternatives and embodiments) should be understood as being not mutually exclusive and can be combined with each other.

DETAILED DESCRIPTION OF PARTICULAR EMBODIMENTS

The steps of a method for making semi-conductor nanocrystals according to a first embodiment are described in connection with FIGS. 1 and 2.

The method for making semi-conductor nanocrystals is implemented from a first SOI substrate 100 (represented in FIG. 1) comprising a thin layer (having a thickness lower or equal to about 1 µm, and preferably between about 1 nm and 100 nm), of monocrystalline silicon 102, having a crystallographic orientation (001), covering a buried dielectric layer 104 comprising $SiO_2$ which rests on a monocrystalline silicon thick layer 106 forming the layer supporting the SOI substrate.

Figure 2:
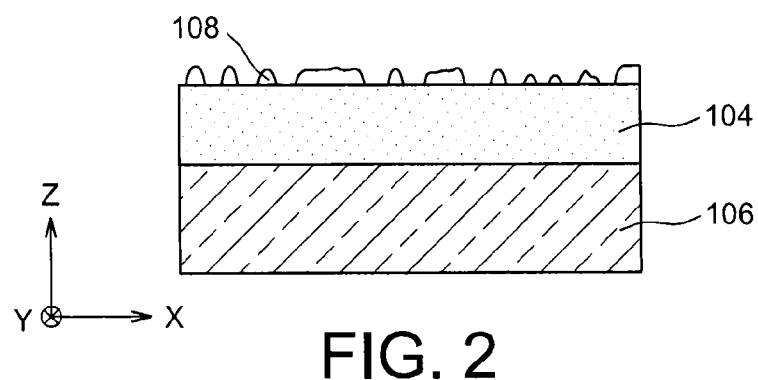

The method is also implemented for a second, third and fourth SOI substrate, having similar structures to that of the first SOI substrate 100, but wherein the silicon thin layer 102 is composed of silicon called biaxially stressed in the plane of the layer 102, that is in both directions X and Y represented in FIG. 1. This biaxial stressed condition is equivalent to a biaxial strain undergone by the silicon of the thin layer 102 in both directions X and Y, passing from the stress condition to the strain condition bijectively occurring by the so-called "Young's law" linear law. The biaxial strains undergone by the silicon of the thin layers of the second, third and fourth substrates are equal to 0.76%, 1.15% and 1.56%, respectively, the second substrate thus corresponding to a 0.76% sSOI substrate, the third substrate corresponding to a 1.15% sSOI substrate, and the fourth substrate corresponding to a 1.76% sSOI substrate.

The silicon thin layers of these four substrates have undergone a thinning step (achieved by high temperature oxidizing followed by a hydrofluoric acid etching), the silicon thin layer 102 of the first SOI substrate having a thickness equal to about 7 nm, that of the second 0.76% sSOI substrate having a thickness equal to about 7.5 nm, that of the third 1.15% sSOI substrate having a thickness equal to about 8.6 nm, and that of the fourth 1.56% sSOI substrate having a thickness equal to about 8.2 nm.

Generally, the dielectric layer 104 on which is provided the semi-conductor thin layer 102 can correspond to a layer or a stack of several layers composed of $SiO_2$ and/or $Si_3N_4$ and/or $Si_xN_y$ (non-stoichiometric silicon nitride) and/or $Si_xO_yN_z$ and/or any other dielectric material. Furthermore, the, or the at least one, dielectric layer can be inherently stressed, or prestressed, for the semi-conductor thin layer 102 also to become stressed once the pattern etching is made in the layer 102 and in all or part of the thickness of the prestressed layer integrated in the stack 104. Furthermore, the semi-conductor of the thin layer 102 may be a semi-conductor other than silicon, for example germanium or an alloy of silicon and germanium, or III-V material, for example GaN and/or AsGa and/or AlGaN and/or InGaN. If the thin layer 102 is not etched, and if the semi-conductor of the thin layer 102 is of the same nature as that of the supporting layer 106 which ensure the rigidity of the stack formed by the layers 102, 104 and 106, the semi-conductor of the thin layer 102 will be marginally stressed. If the semi-conductor of the thin layer 102 is not of the same nature as that of the supporting layer 106, the semi-conductor of the thin layer 102 will be in a biaxially stressed condition related to a thermal expansion coefficient deviation $\Delta\alpha$ and a temperature deviation $\Delta T$ between the formation temperature of the thin layer 102 and the annealing temperature resulting in the dewetting of the thin layer 102. The thin layer 102 is then in a biaxial strain condition $\Delta\alpha \times \Delta T$ equivalent to the above mentioned biaxial stress condition.

The supporting layer 106 can be formed by a single layer or a stack of several materials comprising for example doped silicon, germanium and/or a $Si_{1-x}Ge_x$ type alloy, where x represents the germanium concentration of the alloy such that $0 \leq x \leq 1$. This stack of different materials can be defined on a part only of the supporting layer 106, for example by performing an implantation of dopants through a mask performing a local doping of at least one of the semi-conducting materials of the supporting layer 106.

From the above described four substrates, samples are made having a width equal to about 5 mm and a length equal to about 10 mm (dimensions in the plane (X,Y) represented in FIG. 1). Because these dimensions are much higher than the total thickness of each substrate which corresponds to the thickness of the samples, these dimensions therefore have no influence on the dewetting process of the semi-conductor thin layer which will be made thereafter. The implementations herein illustrated are thus representative of what occurs at the scale of a wafer the diameter of which is great as compared to the thickness of the stack 102/104/106.

A treatment of the semi-conductor thin layer 102 is first performed prior to forming, at the surface of this semi-conductor thin layer, carbon chemical species.

In a first embodiment, a chemical treatment of the upper surface of the silicon thin layer 102 is first performed.

Indeed, impurities, comprising carbon chemical species, naturally occur at the surface of the silicon thin layer 102. These impurities come from the environmental pollution wherein the substrate lies, for example the pollution naturally found in a scanning electron microscope.

Thus, a chemical treatment of the surface of semi-conductor thin layer 102 is made enabling the amount of impurities present at the surface of the thin layer 102 to be controlled, and in particular reduced. This chemical treatment can be performed by using a piranha type solution (mixture having a variable sulphuric acid ($H_2SO_4$) and hydrogen peroxide ($H_2O_2$) concentration), applied at a temperature for example equal to about 140° C. for a duration equal to about 20 min, and a buffered oxide etch (BOE) applied for about 20 seconds in order to remove possible portions of semi-conductor oxide present on the silicon thin layer 102.

When the substrates then undergo an annealing at a temperature between for example about 600° C. and 800° C., these impurities decompose and form aggregates of impurities the density of which, at the surface of the thin layer 102, can be between 0.1 and 1000 aggregates/$\mu m^2$. In the example described herein, that is under the application conditions of the chemical solution previously described followed by an annealing at a temperature between 600° C. and 800° C. (for example equal to about 800° C.), the aggregates of impurities are formed on the thin layer 102 with a density equal to about 500 aggregates/$\mu m^2$. These aggregates mainly consist of semi-conductor carbide, here silicon carbide (SiC) as the layer 102 is composed of silicon, and can contain decomposition products of the initial impurities (hydrogen, nitrogen, etc.) and have a height (dimension along the axis Z) for example between about 1 and 4 nm.

After the carbon chemical species have been formed on the semi-conductor thin layer 102, a high temperature annealing (for example equal to about 800° C., but which can be between about 600° C. and 1250° C.) is made resulting in the semi-conductor of the thin layer being dewetted, and forming the silicon nanocrystals 108 onto the dielectric layer 104. The nucleation temperature of the SiC aggregates can be lower than the temperature from which the dewetting of the semi-conductor starts. The high temperature annealing can be performed at a temperature different from that of the annealing previously implemented and forming the aggregates of impurities. However, both annealings can be continuously performed at a same temperature, for example equal to about 800° C., or more generally between about 600° C. and 800° C.

For the first SOI substrate 100, the dewetting of the silicon from the thin layer 102 forms silicon nanocrystals 108 the average height of which is equal to about 47 nm and the area of which (in the plane (X,Y), measured at a distance about 20 nm from the dielectric layer 104) is on average equal to about 15600 $nm^2$. By way of comparison, when a similar annealing of the first SOI substrate 100 resulting in the dewetting of the silicon from the thin layer 102 is performed, but without prior chemical treatment enabling the amount of carbon chemical species to be reduced on the thin layer 102, the average height of the silicon nanocrystals is equal to about 68 nm and their average area is equal to about 26000 $nm^2$. For the second 0.76% sSOI substrate, the average height of the silicon nanocrystals 108 is equal to about 41 nm and the average area is equal to about 17000 $nm^2$ (by way of comparison, without the chemical treatment reducing the amount of carbon chemical species at the surface of the semi-conductor thin layer 102, the average height of the nanocrystals is equal to about 71 nm and their average area is equal to about 36500 $nm^2$). For the fourth 1.56% sSOI substrate, the average height of the silicon nanocrystals 108 is equal to about 40 nm and the average area is equal to about 12000 $nm^2$ (by way of comparison, without the chemical treatment reducing the amount of carbon chemical species at the surface of the semi-conductor thin layer 102, the average height of the nanocrystals is equal to about 51 nm and their average area is equal to about 22000 $nm^2$).

Thus, the higher the density of carbon aggregates, or nanocrystals, formed on the semi-conductor thin layer 102, the lower the dimensions of the semi-conductor nanocrystals obtained through dewetting.

The above results also show that the higher the stress undergone by the semi-conductor, the more reduced the dimensions of the semi-conductor nanocrystals.

In the absence or presence of small amounts of carbon chemical species, that is resulting in a density of carbon aggregates, or nanocrystals, being lower or equal to the density of semi-conductor nanocrystals obtained after dewetting, for example by minimizing a carbon environmental pollution by optimizing (that is reducing) the substrate duration of exposure to an environmental pollution between the thinning step and the ultra-high vacuum annealing, for a silicon thin layer 102 having a thickness between about 7 nm and 9 nm, silicon nanocrystals are obtained having the following dimensions and densities:

for the first SOI substrate, the density of the silicon nanocrystals is equal to about 2.6 nanocrystals/$\mu m^2$, the average height of these nanocrystals is equal to about 100 nm and their average area, measured at about 20 nm from the interface between the layers 102 and 104, being equal to about 39200 $nm^2$;

for the second 0.76% sSOI substrate, the density of the silicon nanocrystals is equal to about 5.6 nanocrystals/$\mu m^2$, the average height of these nanocrystals is equal to about 75 nm and their average area, measured at about 20 nm from the interface between the layers 102 and 104, being equal to about 28100 $nm^2$;

for the third 1.15% sSOI substrate, the obtained density of the silicon nanocrystals is equal to about 10.1 nanocrystals/$\mu m^2$, the average height of these nanocrystals being equal to about 60 nm and their average area, measured at about 20 nm from the interface between the layers 102 and 104, being equal to about 18500 $nm^2$;

for the fourth 1.56% sSOI substrate, the obtained density of the silicon nanocrystals is equal to about 17.2 nanocrystals/$\mu m^2$, the average height of these nanocrystals being equal to about 45 nm and their average area, measured at about 20 nm from the interface between the layers 102 and 104, being equal to about 13500 $nm^2$;

The strain undergone by the stressed semi-conductor can reach about 1.56% for a layer thickness in the order of 10 nm or less. This strain can be higher but in this case, the layer is made with a lower thickness so that the latter is not higher than a critical thickness beyond which the layer elastically relaxes through dislocation emission.

The high temperature annealing, resulting in the semi-conductor being dewetted, is implemented in a UHV ("Ultra-High Vacuum") environment, for example at a pressure equal to about $10^{-9}$ mbar. This annealing is for example implemented in a scanning electron microscope (SEM) or an atomic force microscope (AFM), such as a Veeco Dimension 3100 type microscope. The annealing is for example performed at a temperature between 700° C. and 1000° C., and for example at a temperature equal to about 800° C. +/−10° C., for a duration between about a few minutes and a few tens of minutes (for example 10 minutes).

Since the dewetting kinetics is controlled by surface diffusion, the higher the annealing temperature, the shorter the annealing duration enabling the dewetting of the semi-conductor of the thin layer 102 to be made.

In a second embodiment, the step of chemically treating the silicon thin layer 102 can be replaced by depositing carbon chemical species, forming on at least one part of the thin layer 102 a carbon layer the thickness of which will be selected as a function of the desired density of the silicon nanocrystals, as well as a function of the desired dimensions of theses silicon nanocrystals.

The carbon layer is formed by exposing, or irradiating, the silicon thin layer 102 by an electron beam for a duration proportional to the desired carbon thickness. The carbon is locally deposited in order to define, at the surface of the thin layer 102, a polluted surface whereas its environment is not or few polluted. The carbon making up the layer formed by exposing the semi-conductor thin layer 102 comes from the environmental pollution surrounding the substrate, and corresponds for example to the environmental pollution within a scanning electron microscope. The electron beam has for example an amperage equal to about 0.58 μA and a voltage of about 15 kV. In order to compare different obtainable results, on each of the four substrates, four areas are respectively insulated for a duration of about 30 s, 60 s, 120 s and 300 s. A 120 s exposure forms a carbon layer having an average thickness equal to about 0.5 nm. A 300 s irradiation forms a carbon layer having an average thickness equal to about 1 nm.

After a 10 minute 900° C. annealing (in a ultra-high vacuum), carbon aggregates, or nanocrystals, mainly consisting of semi-conductor carbide, such as SiC, are formed on the semi-conductor thin layer 102. The density of these aggregates is proportional to the thickness of the initially formed carbon layer. The height of these carbon aggregates corresponds to the observed height of the aggregates of impurities when the chemical treatment of the surface of the thin layer 102 (height between about 5 nm and 20 nm) is not performed. For each of the different carbon layers made, SiC aggregate densities are obtained which are equal to: 15.8 aggregates/$\mu m^2$ (corresponding to the carbon layer formed by a 30 s exposure), 22.6 aggregates/$\mu m^2$ (corresponding to the carbon layer formed by a 60 s exposure), 34 aggregates/$\mu m^2$ (corresponding to the carbon layer formed by a 120 s exposure), and 52.6 aggregates/$\mu m^2$ (corresponding to the carbon layer formed by a 300 s exposure), Therefore, it can be seen that the density of SiC carbon aggregates can be controlled, which can be between 0.1 and 1000 aggregates/$\mu m^2$ by selecting beforehand the thickness of the carbon species layer deposited onto the silicon.

By prolonging the annealing for 15 minutes, the dewetting of the silicon of the thin layer 102 is then observed, forming the silicon nanocrystals 108. The density of these formed nanocrystals 108 is proportional to the density of the previously formed carbon aggregates. For each of the carbon layers, densities of Si nanocrystals are obtained which are equal to about 17.9 nanocrystals/$\mu m^2$ (corresponding to the 30 s exposure), 20.3 nanocrystals/$\mu m^2$ (corresponding to the 60 s exposure), 26.5 nanocrystals/$\mu m^2$ (corresponding to the 120 s exposure) and 37.6 nanocrystals/$\mu m^2$ (corresponding to the 300 s exposure). Generally, in this second embodiment, it is possible to achieve a density of semi-conductor nanocrystals between about 1 and 1000 aggregates/$\mu m^2$.

The semi-conductor nanocrystals 108 formed on the dielectric layer 104 can then be used to make the nanoscale electronic devices, such as memory devices wherein the electric active areas correspond to the nanocrystals 108, or LED type devices, comprising an emitting layer taking advantage of the photoluminescence of the nanocrystals formed.

In one alternative, it is possible to make semi-conductor nanocrystals by combining both above described embodiments, that is by performing a chemical treatment of the surface of the semi-conductor thin layer 102 in order to reduce the amount of impurities lying on the semi-conductor thin layer 102, and then by forming a carbon layer, the thickness of which will be selected for example as a function of the duration of an exposure of the semi-conductor thin layer 102, and by then performing an annealing resulting in a formation of aggregates of carbon impurities and then the dewetting of the semi-conductor of the thin layer 102. The amount of carbon species formed onto the semi-conductor can thus be better controlled by reducing the impact of the environmental pollution. Under these conditions, only the exposure duration can have an influence on the amount of carbon species formed onto the semi-conductor because the amount of carbon species provided by the exposure is great as compared to that provided by the environmental pollution.

Finally, this reduction in the dimensions of the semi-conductor nanocrystals 108 can also be increased by stressing the semi-conductor of the thin layer 102. The stress undergone by the semi-conductor can be used as a parameter to change the dimensions and/or the density of the semi-conductor nanocrystals. The higher the stress, the higher the density of the obtained semi-conductor nanocrystals and the lower the dimensions of these nanocrystals.

Figure 3A:
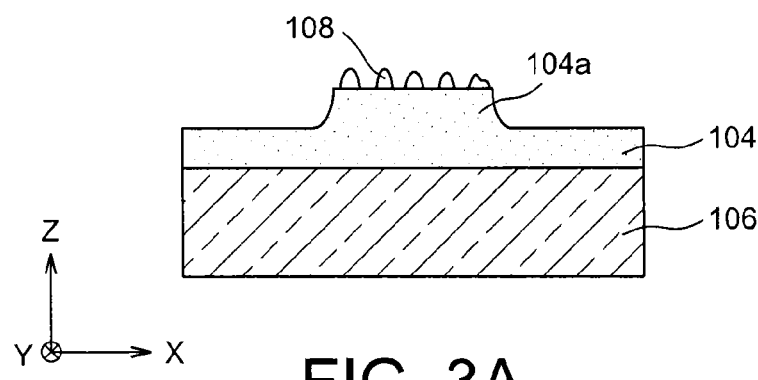
FIGS. 3A and 3B represent the nanocrystals obtained by implementing a method for making semi-conductor nanocrystals.
Figure 3B:
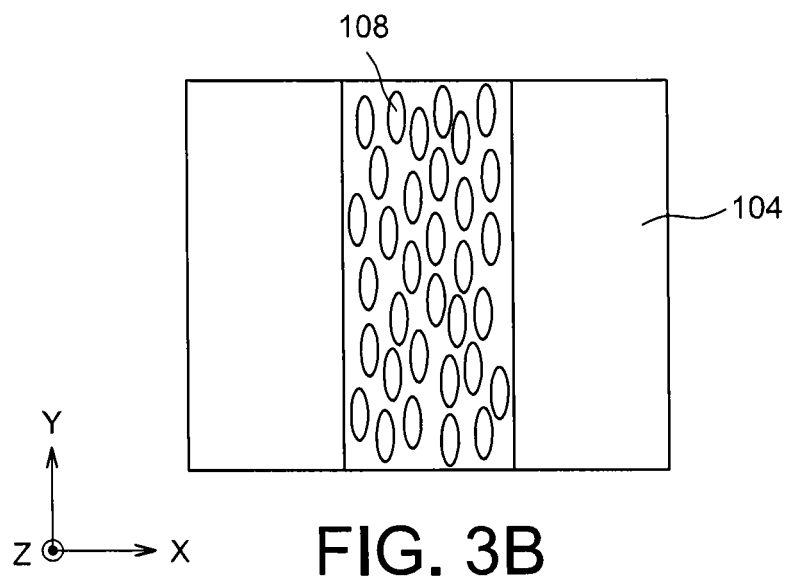

When the semi-conductor is stressed, some nanocrystals formed by dewetting have an elongated shape, for example rectangular. When the semi-conductor is biaxially stressed, the orientation of these nanocrystals, in the plane of the semi-conductor layer, is randomly distributed along the main crystallographic directions of the semi-conductor thin layer 102. To be able to select the orientation of a majority of these nanocrystals having an elongated shape, the semi-conductor can be advantageously uniaxially stressed. A so-called uniaxial stress corresponds to the case where the stress is exerted onto the semi-conductor only in a single direction, but also to the case where the stress is mainly exerted onto the semi-conductor along a direction with an intensity at least twice, and preferably at least ten times, higher than the intensities of the other possible stresses exerted onto the semi-conductor along the other directions. In this case, during the dewetting, the nanocrystals 108 having an elongated shape are oriented perpendicularly to the stress axis of the semi-conductor. Thus, at least 60% of the nanocrystals have an elongated shape and are oriented perpendicularly to the stress axis. Preferentially, compared to a non-stresses semi-conductor, around 90% of the nanocrytals have an elongated shape and are oriented perpendicularly to the stress axis in the case of a stress equal to around 1.6%, and around 60% of the nanocrytals have an elongated shape and are oriented perpendicularly to the stress axis in the case of a stress equal to around 0.8%. The lowest dimension of the nanocrystals/dielectric layer 104 interface is therefore obtained in the direction wherein the stress is initially imposed to minimize the total energy of the system. FIGS. 3A and 3B respectively represent a profile cross-section view and a top view of nanocrystals 108 having an elongated shape which are made on a dielectric rectangular portion 104a uniaxially stressed along the axis Y (the semi-conductor which was initially on the portion 104a was uniaxially stressed along the axis X).

Such a semi-conductor layer uniaxially stressed can be made by using a substrate comprising a prestressed dielectric layer 104 provided between the thin layer 102 and the supporting layer 106, and then by etching the thin layer 102 and the dielectric layer 104 according to a pattern such that the stress exerted on the dielectric layer 104 be uniaxial. Exemplary embodiments of a semi-conductor thin layer uniaxially stressed are for example described in document US 2006/091105 A1.

The stress can also be provided by a layer of stressed semi-conductor material being part of the supporting layer 106. The supporting layer 106 can be formed by a silicon substrate on which has been epitaxially grown a silicon and germanium alloy the stress (or strain) of which is defined by a germanium concentration of this alloy. A thin silicon layer can form an interface between the Si—Ge alloy and the dielectric stack 104. The thin layer 102 will then be stressed upon defining a pattern by successively etching the thin layer 102, the dielectric layer(s) 104 and all or part of the thickness of the alloy layer consisting of Si—Ge.

Figure 4:
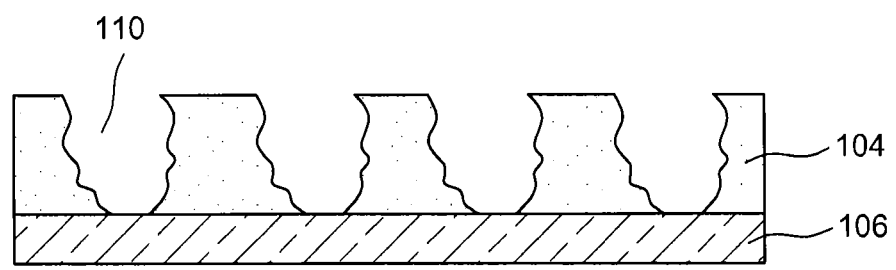
FIG. 4 represents a porous dielectric layer obtained by prolonging the annealing performed during a method for making the semi-conductor nanocrystals.

The annealing can be performed until all the semi-conductor of the thin layer is dewetted and forms the nanocrystals 108. By prolonging the annealing (or by starting, after the dewetting, another annealing) after the dewetting of all the semi-conductor, and because of the high temperature, the silicon nanocrystals 108 react with the material of the dielectric layer 104, regardless of the presence of a stress or not. In the example described herein, there is the reaction: $SiO_2+Si->2SiO$. Because SiO evaporates, the silicon then forms through the dielectric layer 104 holes 110 such as represented in FIG. 4. The reaction occurring between the semi-conductor nanocrystals and the dielectric material can entirely consume the nanocrystals. The holes 110 have a particular shape due to the spiral movement of the nanocrystals 108 when they "hollow out" the $SiO_2$ from the dielectric layer 104. Although irregular, these holes 110 have a substantially conical shape. In the example described herein, the holes 110 pass through the entire thickness of the dielectric layer 104 and open onto the thick silicon layer 106.

Because the above described method enables the dimensions and density of the silicon nanocrystals 108 to be controlled, it is therefore possible to define and control the dimensions and density of the holes 110 formed. The dimension of the holes 110 at the upper face of the dielectric layer 104 (initially corresponding to the interface between layers 102 and 104) is between about 1 and 5 times the diameter of the semi-conductor nanocrystals initially formed before their reaction with the dielectric material of the layer 104. The holes 110 formed have a quasi-conical shape the angle of which, with respect to the direction perpendicular to the upper face of the dielectric layer 104, is between about 30° and 75°, for example between 40° and 65°. The size of the holes at the interface between the layers 104 and 106 also depends on the thickness of the layer 104.

The method for making semi-conductor nanocrystals described above therefore enables, by prolonging the annealing, a periodic pattern of holes to be made, the location and the dimensions of which are controllable. Since the depth of formed holes is a function of the duration of annealing performed from the dewetted condition of the semi-conducting layer 102, the depth of the holes 110 can be controlled. The initial thickness of the semi-conductor layer 102, the stress condition of the semi-conductor layer 102 as well as the addition of carbon impurities are parameters enabling the size and density of the silicon nanocrystals, as well as the size and density of the holes 110 to be controlled.

Figure 5:
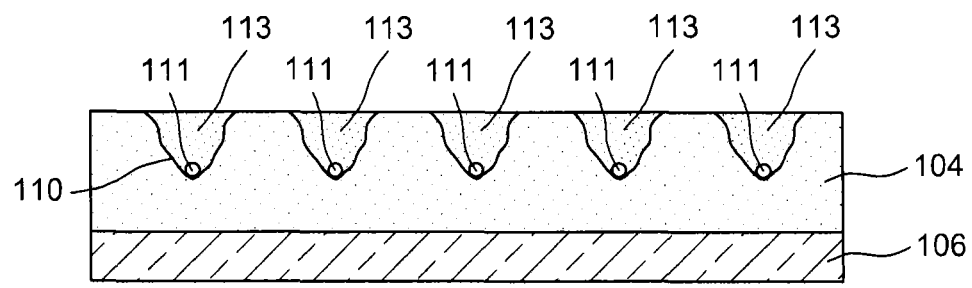
FIGS. 5 to 9 represent several structures obtained thanks to the method for making the semi-conductor nanocrystals.

It is possible to stop the annealing before the holes 110 open onto the interface between the layers 104 and 106. In this case, the semi-conductor nanocrystals are retrieved partly consumed at the bottom of the holes 110 (due to the reaction of the semi-conductor of nanocrystals with the dielectric of the layer 104). Because they are partly consumed, the dimensions of these nanocrystals are reduced as compared to the initial dimensions of the nanocrystals. The dimensions of residual semi-conductor nanocrystals provided at the bottom of the holes are a function of the initial thickness of the semi-conductor layer 102, of the stress condition of the semi-conductor layer 102 as well as the density of carbon impurities formed onto the semi-conducting layer 102. These dimensions can range between 0 (case where the nanocrystals are totally consumed) and the quasi initial dimensions of the nanocrystals (in the case of holes having a very low depth). The holes 110 can then be plugged, for example by a deposition of silicon oxide. When the residual semi-conductor nanocrystals are present at the bottom of the holes, nanocrystals buried within a dielectric layer are obtained in this case. Such a structure is for example represented in FIG. 5, wherein residual nanocrystals 111 are provided at the bottom of the holes 110 which are plugged by portions of dielectric material 113 provided in the holes 110 and covering the residual semi-conductor nanocrystals 111. Such a structure can be used for LED type applications or charge trapping devices in the nanocrystals. In this case, the surrounding dielectric is used to ensure the containment of charges stored in the nanocrystals.

Such a structure can also be obtained from a dielectric layer 104 comprising a stack of different dielectric materials, for example a $SiO_2/Si_3N_4$ or $SiO_2/Si_xO_yN_z$ bilayer, or any other stack comprising at least two dielectric materials whose kinetics of reaction with the semi-conductor of the nanocrystals are different (the kinetics of reaction of the material of the lower layer being selected much lower than that of the material of the upper layer for example composed of $SiO_2$). In this case, for a dielectric layer 104 corresponding for example to a $SiO_2/Si_3N_4$ bilayer, the holes 110 are formed in the $SiO_2$ and the interface between the $SiO_2$ and underlying $Si_3N_4$ forms a natural stop place for the silicon nanocrystals. The final position of the residual semi-conductor nanocrystals within the dielectric layer 104 can thus be controlled through the thickness of the $SiO_2$ layer. As previously, the holes formed in $SiO_2$ can be filled by depositing a material, for example $SiO_2$.

It is also possible to provide the thickness of the dielectric layer 104 and the dimensions of the semi-conductor nanocrystals such that residual semi-conductor nanocrystals are present after passing through the entire thickness of the dielectric layer 104, these residual nanocrystals resting in this case on the thick layer 106.

In all the above described examples, the chemical purity of the semi-conductor nanocrystals is controlled since it corresponds to the chemical purity of the thin layer 102 performed upstream of the method.

Figure 6:
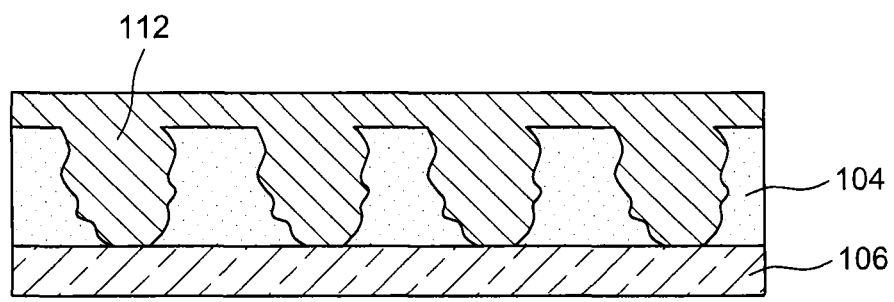
Figure 7:
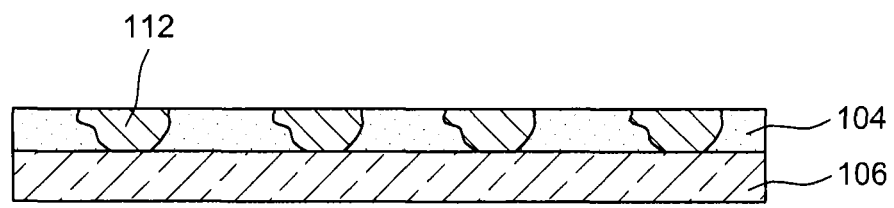

From the obtained porous dielectric layer when the holes 110 fully pass through the dielectric layer 104, it is possible for example to make an array of conducting vias 112 between the front and back faces of the dielectric layer 104. To do this, a vacuum metal deposition (FIG. 6) filling the holes 110 can be made, and then a polishing for removing the metal lying on the upper face of the dielectric layer 104 and projecting from the holes 110. This polishing can also remove part of the thickness of the dielectric layer 104 in order to reduce the dimensions in the plane (X,Y) of the conducting vias 112 (FIG. 7).

Figure 8:
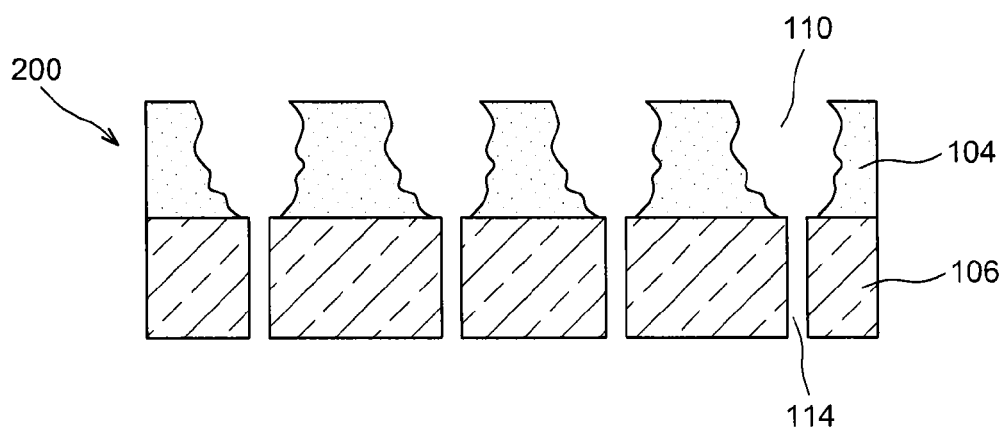
Figure 9:
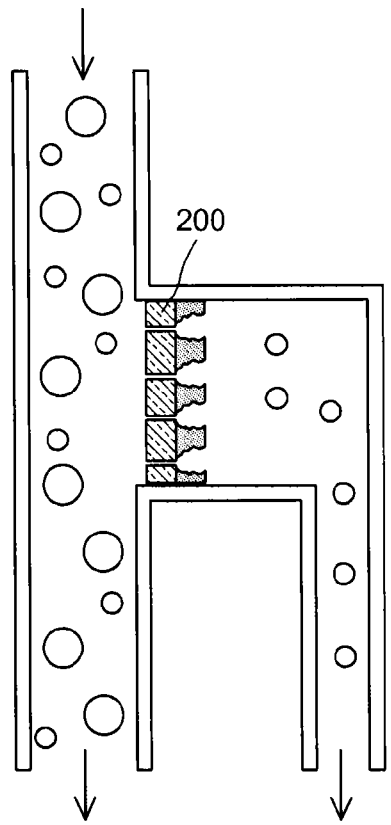

In another embodiment, the porous dielectric layer 104 obtained can act as a microporous membrane. To do this, the silicon thick layer 106 can be etched such that holes 114, located directly below the holes 110 passing through the dielectric layer 104, pass through the entire silicon thick layer 106 (see FIG. 8). Accordingly, a porous membrane 200 which can be used for example as a filter capable of separating liquid or gas molecules, as represented in FIG. 9, is obtained. This porous membrane 200 can also be used in the field of diagnostics, since biological molecules can be deposited into the conical holes, in which case the membrane acts as a detector.

The invention claimed is:

1. A method for making semi-conductor nanocrystals, including at least the steps of:
    forming and controlling a density of solid carbon chemical species on a semi-conductor thin layer provided on at least one dielectric layer;
    annealing the semi-conductor thin layer to perform a dewetting of the semi-conductor and forming, on the dielectric layer, the semi-conductor nanocrystals,
    wherein the desired dimensions and density of the semi-conductor nanocrystals are controlled by the density of the carbon chemical species formed on the semi-conductor thin layer.

2. The method according to claim 1, wherein the formation of carbon chemical species on the semi-conductor thin layer includes a step of chemically treating the semi-conductor thin layer capable of reducing an amount of impurities lying on the semi-conductor thin layer, and annealing the semi-conductor thin layer decomposing the impurities and forming aggregates of impurities corresponding to the carbon chemical species.

3. The method according to claim 2, wherein the chemical treatment step includes applying a solution comprising $H_2O_2$ and $H_2SO_4$ against the semi-conductor thin layer.

4. The method according to claim 1, wherein the formation of carbon chemical species of the semi-conductor thin layer includes a step of depositing carbon onto the semi-conductor thin layer, and annealing the semi-conductor thin layer decomposing the deposited carbon and forming carbon aggregates corresponding to said carbon chemical species.

5. The method according to claim 4, wherein the deposition of carbon onto the semi-conductor thin layer performed in an environment, the environmental pollution of which consists of carbon species and includes exposing the semi-conductor thin layer to an electron beam.

6. The method according to claim 1, wherein the semi-conductor of the thin layer is stressed, the value of this stress being selected as a function of the desired dimensions and density of the semi-conductor nanocrystals.

7. The method according to claim 6, wherein the semi-conductor of the thin layer is uniaxially stressed.

8. The method according to claim 1, wherein the annealing of the semi-conductor thin layer forming the semi-conductor nanocrystals is performed at a temperature between about 600° C. and 1250° C. and in a ultra-high vacuum environment.

9. The method according to claim 1, wherein the steps of forming the carbon chemical species and annealing the semi-conductor thin layer are implemented in a scanning electron microscope.

10. The method according to claim 1, wherein the annealing of the semi-conductor thin layer is prolonged until the semi-conductor nanocrystals chemically react with the dielectric layer forming a plurality of holes passing partially or totally through the dielectric layer.

11. The method according to claim 10, further including, after the step of annealing the semi-conductor thin layer, a step of plugging the holes by depositing at least one material into the holes.

* * * * *